(12) United States Patent
Miyaji

(10) Patent No.: US 11,551,984 B2
(45) Date of Patent: Jan. 10, 2023

(54) PACKAGE

(71) Applicant: NGK SPARK PLUG CO., LTD., Nagoya (JP)

(72) Inventor: Takayuki Miyaji, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 81 days.

(21) Appl. No.: 16/717,092

(22) Filed: Dec. 17, 2019

(65) Prior Publication Data
US 2020/0235019 A1     Jul. 23, 2020

(30) Foreign Application Priority Data
Jan. 17, 2019   (JP) .............................. JP2019-005609

(51) Int. Cl.
*H05K 1/11*         (2006.01)
*H01L 23/053*       (2006.01)
(Continued)

(52) U.S. Cl.
CPC ............ *H01L 23/053* (2013.01); *H01L 24/02* (2013.01); *H02H 9/008* (2013.01); *H05K 1/111* (2013.01);
(Continued)

(58) Field of Classification Search
CPC ....... H01L 23/053; H01L 24/02; H01L 24/13; H01L 24/16; H01L 24/81;
(Continued)

(56) References Cited

U.S. PATENT DOCUMENTS 6,208,156 B1 * 3/2001 Hembree ............... H05K 3/325
324/750.25
9,313,888 B2    4/2016 Akita
(Continued)

FOREIGN PATENT DOCUMENTS

JP        S60-176577 U    11/1985
JP        S64-073696 A     3/1989
(Continued)

OTHER PUBLICATIONS

Japan Patent Office, Office Action (Notice of Reasons for Refusal) issued in corresponding Application No. JP 2019-005609 dated Jun. 25, 2021.
(Continued)

*Primary Examiner* — S M Sohel Imtiaz
(74) *Attorney, Agent, or Firm* — Stites & Harbison, PLLC; Jeffrey A. Haeberlin; James R. Hayne

(57) ABSTRACT

A package has a package body formed by stacked insulating layers and having a front surface including a mounting area, a back surface and a side surface; a plurality of hollow portions arranged so as to be adjacent to each other on the front surface of the package body; a plurality of electrode pads individually placed on respective bottom surfaces of the hollow portions; and a partition wall formed by at least one insulating layer that forms the package body and having protruding banks at its both edge sides. Surfaces of the electrode pads are located at a lower position with respect to the front surface of the package body. The hollow portions are arranged at opposite sides of the partition wall. The electrode pads are electrically connected to respective conductor layers that are formed on the back surface and/or the side surface of the package body.

5 Claims, 3 Drawing Sheets

(51) Int. Cl.
*H01L 23/00* (2006.01)
*H02H 9/00* (2006.01)

(52) U.S. Cl.
CPC ............... *H01L 2224/05026* (2013.01); *H01L 2224/05571* (2013.01)

(58) Field of Classification Search
CPC ....... H01L 2224/0401; H01L 2224/131; H01L 2224/16237; H01L 2224/81191; H01L 2924/15174; H01L 23/055; H01L 23/13; H01L 2224/05026; H01L 2224/05571; H01L 23/49805; H01L 23/49827; H02H 9/008; H05K 1/111
See application file for complete search history.

(56) References Cited

U.S. PATENT DOCUMENTS

| | | | | |
|---|---|---|---|---|
| 2003/0166312 | A1* | 9/2003 | Lee | H01L 23/13 |
| | | | | 438/107 |
| 2013/0181251 | A1* | 7/2013 | Higuchi | H01L 25/167 |
| | | | | 257/99 |
| 2015/0047893 | A1* | 2/2015 | Akita | H05K 1/111 |
| | | | | 174/268 |
| 2017/0213860 | A1* | 7/2017 | Ukigaya | H01L 27/14627 |
| 2020/0144199 | A1* | 5/2020 | Tsai | H01L 21/56 |

FOREIGN PATENT DOCUMENTS

| | | |
|---|---|---|
| JP | H07-226421 A | 8/1995 |
| JP | H10-41431 A | 2/1998 |
| JP | 2008-263030 A | 10/2008 |
| JP | 2009-283645 A | 12/2009 |
| JP | 2014-127913 A | 7/2014 |
| JP | 2015-039133 A | 2/2015 |
| TW | 445555 B | 7/2001 |

OTHER PUBLICATIONS

European Patent Office, Extended European Search Report issued in corresponding Application No. EP 19 21 0823 dated Apr. 8, 2020.
Japan Patent Office, Office Action (Notice of Reasons for Refusal) issued in corresponding Application No. JP 2019-005609 dated Dec. 21, 2021.
China National Intellectual Property Administration, Notification of First Office Action issued in corresponding Application No. 202010053075.1, dated Oct. 9, 2022.

* cited by examiner

PACKAGE

BACKGROUND OF THE INVENTION

The present invention relates to a package that has a mounting area of an electronic component on a front surface of a package body formed by a plurality of stacked insulating layers, and more particularly to a package that can reduce a tendency for a short circuit to occur between a plurality of electrode pads adjacently provided on the front surface of the package body when electrically connecting external connecting terminals of the electronic component to the plurality of electrode pads.

For example, Japanese Unexamined Patent Application Publication No. 10-41431 (hereinafter is referred to as "JPH10-41431") discloses an airtight seal package in which a pair of internal electrodes provided on a bottom surface at an inner side (in a cavity) of a box-shaped package base body that is formed by a plurality of stacked ceramic layers and a plurality of external electrodes provided on a back surface of the package base body are connected respectively through a plurality of conductive lines that penetrate a lower ceramic layer. Further, JPH10-41431 proposes that the internal electrode should be made of soft metal (such as gold and silver) and a height of the internal electrode should be 30 μm or higher, preferably 50 μm or higher.

According to the airtight seal package of JPH10-41431, propagation of an external stress can be absorbed by the internal electrode, and thus distortion of a crystal element that is mounted on the internal electrodes can be reduced, which eliminate the need for a conventional holding support. As a consequence, man-hour of manufacture and cost can be reduced, and also a requirement as a thin airtight seal package can be met.

SUMMARY OF THE INVENTION

However, in a case where, to meet the requirement of size reduction of the package, the pair of internal electrodes whose height is 30 μm or higher are adjacently arranged on the bottom surface at the inner side (in the cavity) of the package base body, an electronic component is mounted on the pair of internal electrodes with the electronic component lying or placing over the pair of internal electrodes. For this reason, there is a risk that bonding material such as solder provided on each internal electrode will contact each other then an unintentional short circuit will occur.

The present invention was made in view of the above technical problem. An object of the present invention is therefore to provide a package that is capable of reducing a tendency for a short circuit to occur between the plurality of electrode pads when electrically connecting the electronic component, which is mounted later on the mounting area included in the front surface of the package body formed by the plurality of stacked insulating layers, to the plurality of electrode pads, even if the plurality of electrode pads are adjacently arranged on the front surface of the package body.

An idea of the present invention to solve the above technical problem is to arrange the plurality of electrode pads at a lower position with respect to the front surface of the package body including the mounting area where the electronic component is mounted later.

That is, a package recited in claim 1 comprises: a package body formed by stacking a plurality of insulating layers and having a front surface including a mounting area of an electronic component, a back surface located at an opposite side to the front surface and a side surface located between the front surface and the back surface; a plurality of hollow portions arranged so as to be adjacent to each other and opening on the front surface of the package body; a plurality of electrode pads individually placed on respective bottom surfaces of the hollow portions; and a partition wall formed by at least one insulating layer that forms the package body and having protruding banks that swell upward at both edge sides, on a front surface side, of the partition wall. And, surfaces of the electrode pads are located at a lower position with respect to the front surface of the package body, the plurality of hollow portions are arranged, when viewed from above, so as to be adjacent to each other at opposite sides of the partition wall, and the electrode pads are electrically connected to respective conductor layers that are formed on the back surface and/or the side surface of the package body.

According to the above package, the following effects (1) and (2) can be obtained.

(1) Since the surfaces of the plurality of electrode pads individually placed on the respective bottom surfaces of the plurality of hollow portions adjacently arranged and opening on the front surface of the package body are located at a lower position with respect to the front surface of the package body, in the case where the electronic component is mounted on the mounting area later to establish electric connection to the electrode pads, when individually connecting (bonding) a plurality of external connecting terminals of the electronic component to the surfaces of the plurality of electrode pads with solder etc., a tendency for an unintentional short circuit caused by contact of the solders to occur can be reduced.

(2) Since the surfaces of the plurality of electrode pads are individually placed at respective bottom surface sides of the hollow portions that are located at a lower position with respect to the front surface of the package body, when mounting the electronic component on the mounting area for establishment of the electric connection to the electrode pads, it is possible to insert the plurality of external connecting terminals of the electronic component into the respective hollow portions, then positioning of the external connecting terminals can be made easily and surely.

Further, according to the above package, since the plurality of hollow portions are arranged, when viewed from above, so as to be adjacent to each other at opposite sides of the partition wall formed by at least one insulating layer that forms the package body, the above effects (1) and (2) can be surely obtained.

Here, a width of the partition wall located between the adjacent two hollow portions and formed by the insulating layer is 1 mm or less, and a minimum value of the width is substantially 200 μm.

The insulating layer is made of ceramic or resin. The ceramic is a high temperature co-fired ceramic such as alumina or a low temperature co-fired ceramic such as glass-ceramic. The resin is, for instance, epoxy resin.

The conductor layer is a back surface terminal (a back surface connecting terminal) or a side surface conductor. And, the electrode pad is electrically connected to the back surface terminal or the side surface conductor through an inside layer connecting line or a via conductor.

Further, in a case where the insulating layer is made of alumina, as material of the electrode pad and the conductor layer, W (tungsten) or Mo (molybdenum) is used. In a case where the insulating layer is made of glass-ceramic or resin, Cu (copper) or Ag (silver) is used.

Furthermore, surfaces, exposed to the outside, of the electrode pad and the conductor layer are covered with a gold layer through a nickel layer.

The surface of the electrode pad is located at a lower position with respect to the front surface of the package body by at least 50 μm or greater.

Here, "adjacent" means that the plurality of hollow portions are adjacently arranged close to each other, when viewed from above, on the front surface of the package body.

As the electronic component, it could be a quartz oscillator (or a quartz resonator), a light-emitting device such as an LED (light-emitting diode) and a semiconductor device.

The external connecting terminal of the electronic component is, for instance, a plate-shaped lead, a lead pin and a ball terminal.

The hollow portion is formed by forming a penetration hole by stamping or punching or laser beam machining of one insulating sheet (one insulating layer) of the plurality of insulating layers and by stacking a flat insulating sheet (a flat insulating layer) on a back surface side of the insulating sheet (the insulating layer).

The present invention includes a package of claim 2. Claim 2 recites the following: the plurality of hollow portions and the mounting area of the electronic component are separate from each other or overlap each other, when viewed from above, on the front surface of the package body.

In the case where the plurality of hollow portions and the mounting area of the electronic component are separate from each other when viewed from above, positioning of the electronic component can be made readily and accurately by inserting a plurality of external connecting terminals (e.g. the leads), each of which extends or protrudes from one side surface of the electronic component toward an obliquely lower side, into respective openings of the hollow portions. Therefore, the effect (2) can be surely obtained.

On the other hand, also in the case where the plurality of hollow portions and the mounting area of the electronic component overlap each other when viewed from above, positioning of the electronic component can be made in the same manner, and also this case contributes to reduction in size and in thickness of the package body (an effect (3)).

The present invention includes a package of claim 3. Claim 3 recites the following: each of the electrode pads has, at least at one side thereof, an extending portion that extends on an inside layer surface between the insulating layers forming the package body. According to this package, since the protruding bank, which swells at a corresponding position to the extending side of the electrode pad, is formed on the front surface (the partition wall) of the package body where the extending portion extending on the inside layer surface between the insulating layers is formed, the above effect (1) can be obtained quite surely.

Further, since the protruding bank formed by the extending portion can effectively prevent the external connecting terminal of the later-mounted electronic component from deviating from the hollow portion, the above effect (2) can be obtained quite surely.

Here, in a case where the electrode pads each have a rectangular shape in top view, the extending portion could be provided at adjacent two sides, facing two sides, three sides or the whole four sides of the electrode pads.

In addition, the inside layer connecting line electrically connected to the electrode pad could be formed on the inside layer surface.

The present invention includes a package of claim 4. Claim 4 recites the following: the surfaces of the electrode pads are electrically connected to respective external connecting terminals of the electronic component mounted on the mounting area, or electrically connected to the electronic component with bonding wires.

According to this package, when mounting the electronic component on the mounting area to establish electric connection to the electrode pads, the plurality of external connecting terminals of the electronic component can be brought closer to or into contact with the respective surfaces of the electrode pads through respective openings of the hollow portions. It is therefore possible to surely obtain the above effect (2).

On the other hand, when the surfaces of the electrode pads are electrically connected to the electronic component with bonding wires, positions of the hollow portions when viewed above can be determined or recognized readily and accurately by image processing. Thus, the electric connection of the electronic component to the electrode pads can be accurately established through wire-bonding after the electronic component is mounted on the mounting area (an effect (4)).

The present invention includes a package of claim 5. Claim 5 recites the following: the package further comprises: a frame member having a frame shape along an outer periphery of the front surface on the front surface of the package body, and the hollow portions and the mounting area are enclosed with an inner wall surface of the frame member.

According to this package, since the front surface of the package body, where the hollow portions and the mounting area are formed, is enclosed with the inner wall surface of the frame member, the later-mounted electronic component can be protected from external effects by the frame member, or the later-mounted electronic component can be sealed by the frame member (an effect (5)).

As the frame member, an insulating member made of the same material as that of the insulating layer forming the package body could be used. Further, a metal-made frame member (a metal ring) may also be used.

The front surface, enclosed with the inner wall surface of the frame member, of the package body is a bottom surface of a recessed area (a cavity) where the electronic component is sealed, including the mounting area.

The other objects and features of this invention will become understood from the following description with reference to the accompanying drawings.

DETAILED DESCRIPTION OF THE INVENTION

Embodiments of the present invention will be explained below with reference to the drawings.

Figure 1A:
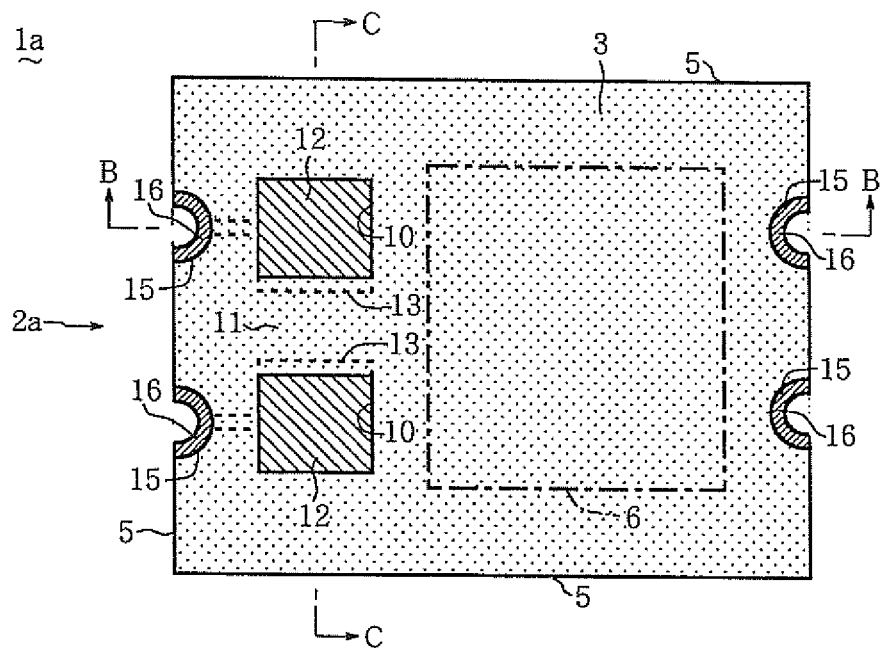
FIG. 1A is a plan view of a package according to an embodiment of the present invention.
Figure 1B:
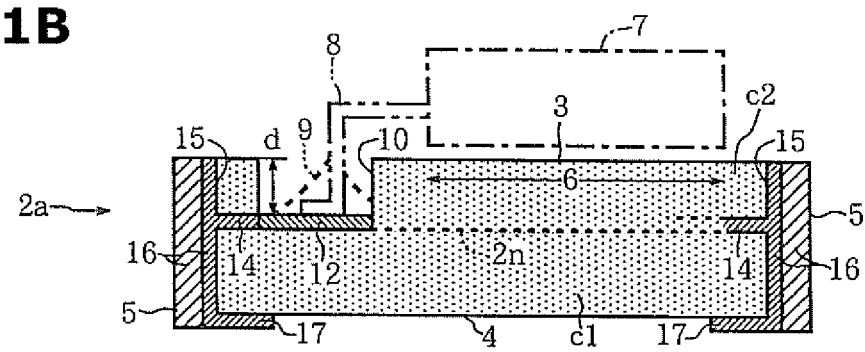
FIG. 1B is a cross section vertically cut by a plane passing through a B-B line of FIG. 1A.
Figure 1C:
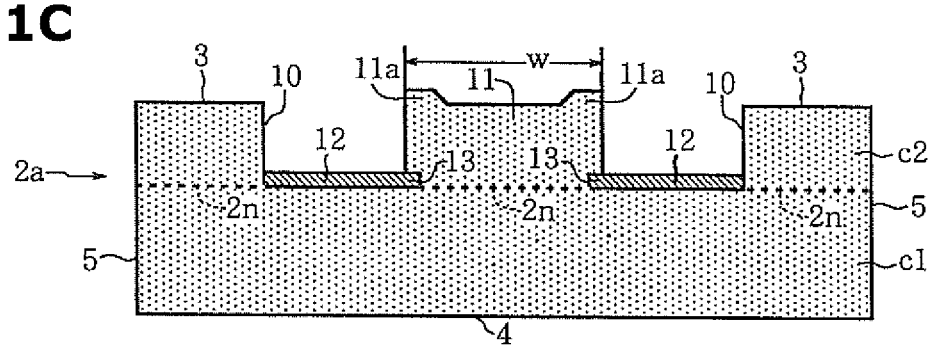
FIG. 1C is a cross section vertically cut by a plane passing through a C-C line of FIG. 1A.

FIG. 1A is a plan view of a package 1a according to an embodiment of the present invention. FIG. 1B is a cross section vertically cut by a plane passing through a B-B line of FIG. 1A. FIG. 1C is a cross section vertically cut by a plane passing through a C-C line of FIG. 1A.

As shown in FIGS. 1A to 1C, the package 1a has a package body 2a having a plate shape as a whole, a pair of (a plurality of) hollow portions 10 arranged so as to be adjacent to each other when viewed from above and opening on a front surface 3 of the package body 2a and a pair of electrode pads 12 individually placed on respective bottom surfaces of the hollow portions 10.

The package body 2a is formed by stacking upper and lower two ceramic layers (insulating layers) c1 and c2. This package body 2a has the front surface 3 whose shape in top view is a rectangle (a rectangular shape), a back surface 4 located at an opposite side to the front surface 3 and four side surfaces 5 positioned at four sides between the front surface 3 and the back surface 4.

The ceramic layers c1 and c2 are made of high temperature co-fired ceramic such as alumina.

A mounting area 6 that is a rectangular area, viewed from above, where an electronic component (e.g. a semiconductor device) 7 is mounted later, the pair of hollow portions 10 formed separately from the mounting area 6 when viewed from above on the front surface 3, and the pair of electrode pads 12 individually placed at respective bottom surface sides of the hollow portions 10 are arranged on the front surface 3 of the package body 2a. Further, the pair of hollow portions 10 are separate and isolated from each other by a partition wall 11 that is formed by a part of the upper ceramic layer c2 and has a linear shape (a rectangular shape) in top view.

Here, a depth d from an opening of the hollow portion 10 to a surface of the electrode pad 12 is at least 50 μm or greater, and a width w of the partition wall 11 is 200 μm or greater.

As shown in FIGS. 1A to 1C, the pair of electrode pads 12 are each shaped into a rectangular shape in top view on an inside layer surface 2n between the ceramic layers c1 and c2. Further, the pair of electrode pads 12 have respective extending portions 13 that are formed by adjacent or facing one sides of the pair of electrode pads 12 extending to respective overlapping positions with the partition wall 11 on the inside layer surface 2n. The partition wall 11 has, at its both edge sides on the front surface 3 side corresponding to the extending portions 13, protruding banks 11a that swell upward.

Furthermore, as can be seen in FIGS. 1A and 1B, on the pair of side surfaces 5 located at short sides of the package body 2a, a pair of recessed grooves 15 whose top views are a semicircle are formed in a vertical direction. Also, side surface conductors (conductor layers) 16 whose top views are an arc shape are formed along respective inner wall surfaces of the recessed grooves 15. At least the pair of side surface conductors 16 located at a left side in FIGS. 1A and 1B are electrically connected to the respective electrode pads 12 through connecting lines 14 that are formed along the inside layer surface 2n. Likewise, the pair of side surface conductors 16 located at a right side in FIGS. 1A and 1B could also be electrically connected to the respective electrode pads 12.

The above four side surface conductors 16 are respectively connected to a plurality of back surface terminals (conductor layers) 17 that are formed separately from each other on the back surface 4 of the package body 2a.

The electrode pad 12, the connecting line 14, the side surface conductor 16 and the back surface terminal 17 are mainly made of W (tungsten) or Mo (molybdenum).

In addition, as shown in FIG. 1B, when mounting the box-shaped electronic component 7 on the mounting area 6 of the front surface 3 of the package body 2a later to establish electric connection to the electrode pads 12, positioning of the electronic component 7 is made by inserting tips of a pair of leads (external connecting terminals) 8, each of which protrudes parallel and vertically in a crank-shaped direction in side view from one side surface of the electronic component 7 toward an obliquely lower side, into the respective openings of the hollow portions 10. Subsequently, by providing bonding material (not shown) between a bottom surface of the electronic component 7 and the mounting area 6 with the tips of the pair of leads 8 contacting the respective surfaces of the electrode pads 12, the electronic component 7 is mounted on the mounting area 6. Then, by providing solder (e.g. gold-tin based alloy) 9 around the tips of the leads 8 so as to form a substantially cone-shaped solder joint, the electronic component 7 and the pair of electrode pads 12 are electrically connected (electric connection is established).

When electrically connecting the electronic component 7 to the electrode pads 12, by the partition wall 11 including the protruding banks 11a which is located between the pair of hollow portions 10, contact of the solders 9 provided to the tips of the leads 8 and the surfaces of the electrode pads 12 is prevented.

In the package 1a explained above, the surfaces of the pair of electrode pads 12 individually placed on the respective bottom surfaces of the pair of hollow portions 10 adjacently arranged and opening on the front surface 3 of the package body 2a are located at a lower position with respect to the front surface 3 of the package body 2a including the mounting area 6. Because of this, in the case where the electronic component 7 is mounted on the mounting area 6 later to establish electric connection to the electrode pads 12, when individually connecting (bonding) the pair of leads 8 of the electronic component 7 to the surfaces of the electrode pads 12 with the solder 9, an unintentional short circuit caused by the contact of the solders 9 provided to the tips of the leads 8 and the surfaces of the electrode pads 12 does not occur.

Further, since the surfaces of the pair of electrode pads 12 are individually placed at the respective bottom surface sides of the hollow portions 10 that are located at a lower position with respect to the front surface 3 of the package body 2a, when mounting the electronic component 7 on the mounting area 6 for establishment of the electric connection to the electrode pads 12, by individually inserting the tips of the pair of leads 8 into the respective hollow portions 10, positioning of the electronic component 7 can be made easily and surely.

Hence, according to the package 1a of the present embodiment, it is possible to surely obtain the aforementioned effects (1) and (2).

Here, the electronic component 7 and the surfaces of the electrode pads 12 could be electrically connected with bonding wires. In this case, in addition to the effects (1) and (2), the aforementioned effect (4) can be obtained.

Figure 2A:
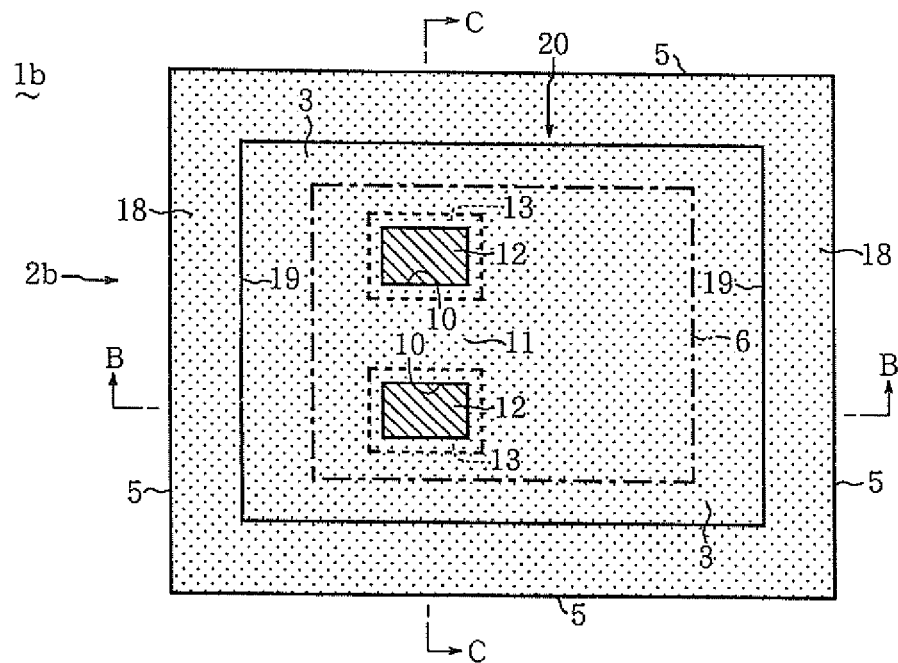
FIG. 2A is a plan view of a package according to an application embodiment.
Figure 2B:
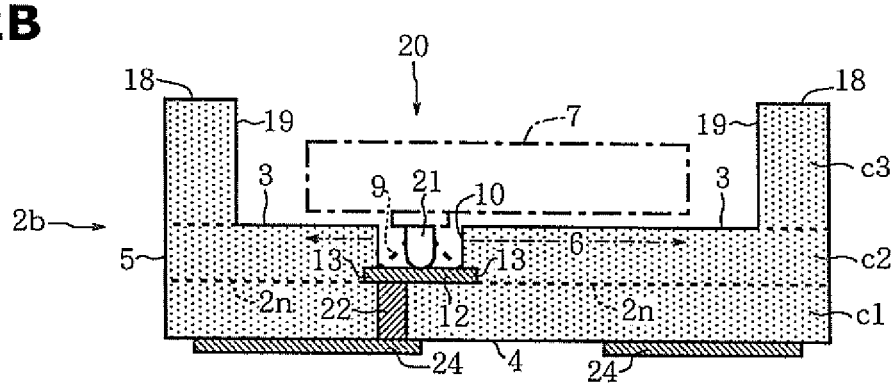
FIG. 2B is a cross section vertically cut by a plane passing through a B-B line of FIG. 2A.
Figure 2C:
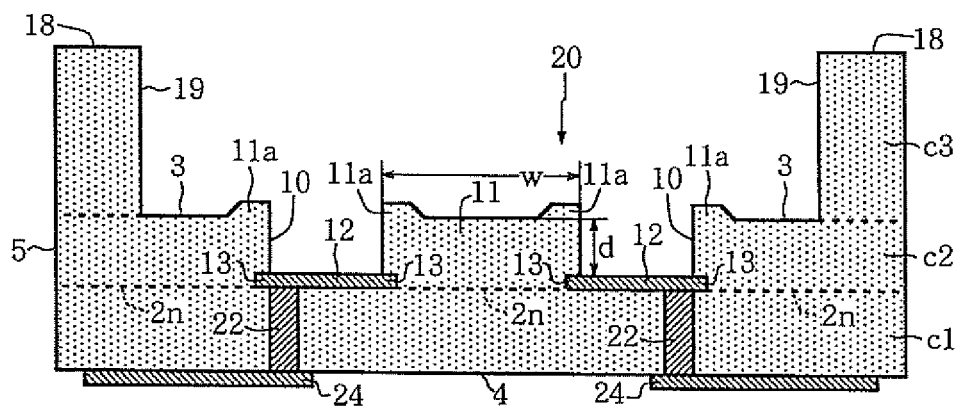
FIG. 2C is a cross section vertically cut by a plane passing through a C-C line of FIG. 2A.

FIG. 2A is a plan view of a package 1b according to an application embodiment of the package 1a. FIG. 2B is a cross section vertically cut by a plane passing through a B-B line of FIG. 2A. FIG. 2C is a cross section vertically cut by a plane passing through a C-C line of FIG. 2A.

As shown in FIGS. 2A to 2C, the package 1b includes the above package body 2a formed by the same ceramic layers c1 and c2, namely that the package 1b has a package body 2b that is formed by further stacking a frame member c3 having a rectangular shape in top view on the package body 2a along an outer periphery of the front surface 3 of the package body 2a. The package 1b further has the same mounting area 6 located on the front surface 3 that is a bottom surface of a recessed area (a cavity) 20 enclosed with an inner wall surface 19 of the frame member c3, a pair of adjacently arranged hollow portions 10 that overlap the mounting area 6 when viewed from above and open within the mounting area 6 and a pair of electrode pads 12 having a rectangular shape in top view and individually placed on respective bottom surface sides of the hollow portions 10.

The frame member c3 is also made of ceramic such as alumina. The frame member c3 is formed by stamping or punching or laser beam machining of a ceramic green sheet that is material at the manufacturing.

The pair of electrode pads 12 each have extending portions 13 that are formed by four sides of each electrode pad 12 extending in four directions by the same width on the inside layer surface 2n between the ceramic layers c1 and c2. Therefore, as shown in FIG. 2C, protruding banks 11a that swell upward are formed along respective entire peripheries of openings of the hollow portions 10 including both edge sides of a partition wall 11. Hence, the aforementioned effects (1) and (2) can be obtained along the entire peripheries of the openings of the hollow portions 10.

As shown in FIGS. 2B and 2C, the pair of electrode pads 12 are respectively electrically connected to a plurality of back surface terminals (conductor layers) 24 formed on the back surface 4 of the package body 2b through via conductors 22 that penetrate the ceramic layer c1. Here, the back surface terminal 24 located at a right side in FIG. 2B is an electrically-independent dummy terminal. However, the via conductor 22 penetrating the ceramic layer c1 could also be provided at this back surface terminal 24 located at the right side in FIG. 2B, then either electrode pad 12 could be electrically connected to this back surface terminal 24.

The via conductor 22 and the back surface terminal 24 are also mainly made of W (tungsten) or Mo (molybdenum).

Further, on a rectangular-shaped upper surface 18 of the frame member c3 forming the recessed area 20, a metallized layer having a similar shape to the upper surface 18 could be provided. The metallized layer is used to bond a metal cover that seals an opening of the recessed area 20 to the frame member c3.

In addition, as shown in FIG. 2B, when mounting a plate-shaped electronic component 7 on the mounting area 6 of the front surface 3 that is the bottom surface of the recessed area 20 of the package body 2b later to establish electric connection to the electrode pads 12, positioning of the electronic component 7 can be made by inserting a pair of lead pins (external connecting terminals) 21, each of which protrudes vertically downward from a bottom surface of the electronic component 7, into respective insides of the hollow portions 10 and bringing tips of the lead pins 21 closer to or into contact with respective surfaces of the electrode pads 12. Subsequently, in this state, by mounting the electronic component 7 on the front surface 3 (the mounting area 6) with bonding material (not shown) that is previously provided on the bottom surface of the electronic component 7, and also by soldering the tips of the lead pins 21 and the surfaces of the electrode pads 12 with solder 9, mount of the electronic component 7 on the mounting area 6 and electric connection of the electronic component 7 to the electrode pads 12 are completed.

In the package 1b described above, in the same manner as the package 1a, besides prevention of the short circuit and positioning of the electronic component 7 at the mount and electric connection of the electronic component 7, since the mounting area 6 of the electronic component 7 overlaps the pair of hollow portions 10 when viewed from above, it is possible to mount and electrically connect the electronic component 7 readily and accurately with the lead pins 21 of the electronic component 7 being individually inserted into the respective hollow portions 10.

Moreover, the electronic component 7 mounted on the mounting area 6 can be protected from external effects by the frame member c3, or the electronic component 7 can be easily sealed by the frame member c3.

Hence, according to the package 1b, in addition to the aforementioned effects (1) and (2), it is possible to further obtain the aforementioned effects (3) and (5).

Here, regarding a position of the extending portion 13, extending on the inside layer surface 2n, of the electrode pad 12, in the same manner as the package 1a, only each one extending portion 13 positioned at the partition wall 11 side could be provided.

Figure 3A:
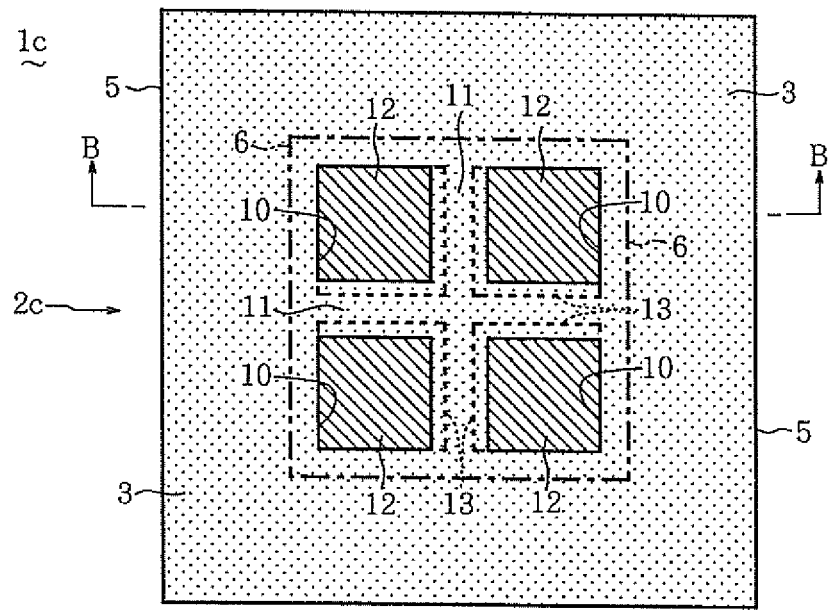
FIG. 3A is a plan view of a package according to another embodiment.
Figure 3B:
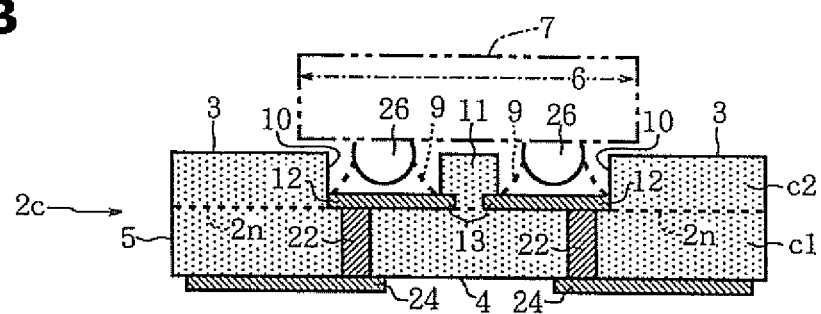
FIG. 3B is a cross section vertically cut by a plane passing through a B-B line of FIG. 3A.

FIG. 3A is a plan view of a package 1c according to another embodiment. FIG. 3B is a cross section vertically cut by a plane passing through a B-B line of FIG. 3A.

As shown in FIGS. 3A and 3B, the package 1c has a package body 2c having a plate shape as a whole, four (a plurality of) hollow portions 10 arranged so as to be adjacent to each other like a grid pattern and opening in a middle area, viewed from above, on a front surface 3 of the package body 2c and four electrode pads 12 individually placed on respective bottom surface sides of the hollow portions 10.

The package body 2c is formed by stacking upper and lower two ceramic layers (insulating layers) c1 and c2. This package body 2c has the front surface 3 whose shape in top view is a square (a rectangular shape), a back surface 4 located at an opposite side to the front surface 3 and four side surfaces 5 positioned at four sides between the front surface 3 and the back surface 4.

The ceramic layers c1 and c2 are also ceramic layers (insulating layers) made of e.g. alumina.

A mounting area 6 having a square shape in top view, where an electronic component 7 is mounted later, the four hollow portions 10 overlapping the mounting area 6 when viewed from above, each having a rectangular shape and arranged so as to be adjacent to each other like the grid pattern within the mounting area 6 on the front surface 3, and the four electrode pads 12 individually placed on the respective bottom surface sides of the hollow portions 10 are adjacently arranged in lateral and longitudinal directions when viewed above in the middle area on the front surface 3 of the package body 2c. Further, the four hollow portions 10 are separate and isolated from each other by partition wall 11 that is formed by a part of the upper ceramic layer c2 and extends in the lateral and longitudinal directions when viewed above from a center of the front surface 3.

The four electrode pads 12 are shaped into a rectangular shape in top view on an inside layer surface 2n between the ceramic layers c1 and c2. Further, the four electrode pads 12 each have extending portions 13 that are formed by adjacent or facing two sides of the electrode pads 12 extending to respective overlapping positions with the partition wall 11 on the inside layer surface 2n. The partition wall 11 has, at its both edge sides in the lateral and longitudinal directions on the front surface 3 side corresponding to the extending portions 13, protruding banks 11*a* that swell upward like an L-shape in top view.

Furthermore, as can be seen in FIGS. 3A and 3B, the four electrode pads 12 are electrically connected to respective four back surface terminals 24 separately formed at four corner sides on the back surface 4 of the package body 2*c* through four via conductors 22 that penetrate the ceramic layer c1. The via conductor 22 and the back surface terminal 24 are also mainly made of W (tungsten) or Mo (molybdenum).

In addition, as shown in FIG. 3B, when mounting the electronic component 7 on the mounting area 6 of the front surface 3 of the package body 2*c* later to establish electric connection to the electrode pads 12, positioning of the electronic component 7 is made by inserting four ball terminals (external connecting terminals) 26, each of which protrudes vertically downward from a bottom surface of the electronic component 7, into respective insides of the hollow portions 10 and bringing tips of the ball terminals 26 closer to or into contact with respective surfaces of the electrode pads 12. Subsequently, in this state, by mounting the electronic component 7 on the front surface 3 (the mounting area 6) with bonding material (not shown) that is previously provided on the bottom surface of the electronic component 7, and also by soldering the tips of the ball terminals 26 and the surfaces of the electrode pads 12 with solder 9, mount of the electronic component 7 on the mounting area 6 and electric connection of the electronic component 7 to the electrode pads 12 are completed. Here, the ball terminal 26 itself could be formed by a solder ball, then by melting and solidifying solder after mounting the electronic component 7 on the front surface 3 (the mounting area 6) with the bonding material, mount and electric connection of the electronic component 7 could be completed.

In the package 1*c* described above, in the same manner as the packages 1*a* and 1*b*, besides prevention of the short circuit and positioning of the electronic component 7 at the mount and electric connection of the electronic component 7, since the mounting area 6 of the electronic component 7 overlaps the four hollow portions 10 when viewed from above, it is possible to mount and electrically connect the electronic component 7 readily and accurately with the ball terminals 26 of the electronic component 7 being individually inserted into the respective hollow portions 10.

Hence, according to the package 1*c*, in addition to the aforementioned effects (1) and (2), it is possible to further obtain the aforementioned effect (3).

Here, regarding a position of the extending portion 13, extending on the inside layer surface 2*n*, of the electrode pad 12, in the same manner as the package 1*b*, four extending portions 13 could be provided at an entire periphery of the electrode pad 12, i.e. at four sides of the electrode pad 12.

Figure 3C:
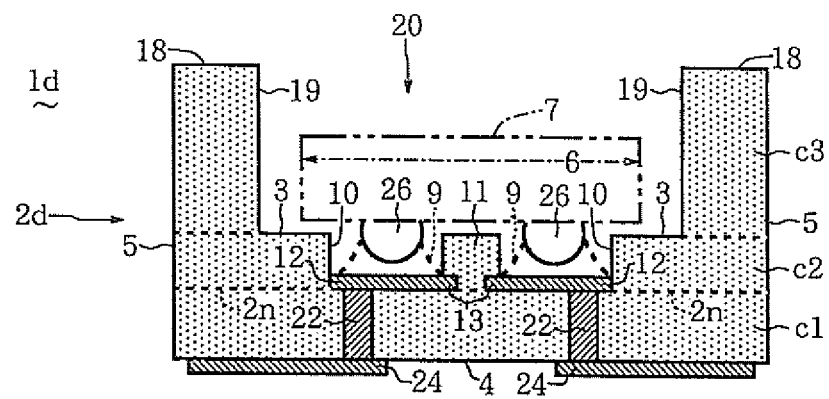
FIG. 3C is a package according to an application embodiment of the above another embodiment, shown by a cross section vertically cut by a plane passing through a C-C line of FIG. 3A.

FIG. 3C is a package 1*d* according to an application embodiment of the package 1*c*, shown by a cross section vertically cut by a plane passing through a C-C line of FIG. 3A.

As shown in FIG. 3C, the package 1*d* includes the above package body 2*c* formed by the same ceramic layers c1 and c2, namely that the package 1*d* has a package body 2*d* that is formed by further stacking the same frame member c3 having the rectangular shape in top view on the package body 2*c* along an outer periphery of the front surface 3 of the package body 2*c*. The package 1*d* further has the same mounting area 6 located on the front surface 3 that is the bottom surface of the recessed area (the cavity) 20 enclosed with the inner wall surface 19 of the frame member c3, adjacently arranged four hollow portions 10 that overlap the mounting area 6 when viewed from above and open within the mounting area 6 and four electrode pads 12 having a rectangular shape in top view and individually placed on respective bottom surface sides of the hollow portions 10.

Here, on a rectangular-shaped upper surface 18 of the frame member c3 forming the recessed area 20, a metallized layer having a similar shape to the upper surface 18 could be provided.

In addition, as shown in FIG. 3C, when mounting the electronic component 7 on the mounting area 6 of the front surface 3 of the package body 2*d* later to establish electric connection to the electrode pads 12, positioning of the electronic component 7 is made by inserting four ball terminals 26, each of which protrudes from a bottom surface of the electronic component 7, into respective insides of the hollow portions 10 and bringing tips of the ball terminals 26 closer to or into contact with respective surfaces of the electrode pads 12. Subsequently, in this state, by mounting the electronic component 7 on the front surface 3 (the mounting area 6) with bonding material (not shown) that is previously provided on the bottom surface of the electronic component 7, and also by soldering the tips of the ball terminals 26 and the surfaces of the electrode pads 12 with solder 9, mount of the electronic component 7 on the mounting area 6 and electric connection of the electronic component 7 to the electrode pads 12 are completed. Here, the ball terminal 26 itself could be formed by a solder ball, then by melting and solidifying solder after mounting the electronic component 7 on the front surface 3 (the mounting area 6) with the bonding material, mount and electric connection of the electronic component 7 could be completed.

Here, a metal cover (not shown) could be welded or brazed to the metallized layer (not shown) provided on the upper surface 18 of the frame member c3, then an opening of the recessed area (the cavity) 20 is sealed.

In the package 1*d* described above, in the same manner as the package 1*c*, besides prevention of the short circuit and positioning of the electronic component 7 at the mount and electric connection of the electronic component 7, since the mounting area 6 of the electronic component 7 overlaps the four hollow portions 10 when viewed from above, it is possible to mount and electrically connect the electronic component 7 readily and accurately with the ball terminals 26 of the electronic component 7 being individually inserted into the respective hollow portions 10. Further, the electronic component 7 mounted on the mounting area 6 can be protected from external effects by the frame member c3, or the electronic component 7 can be easily sealed by the frame member c3.

Hence, also according to the package 1*d*, in addition to the aforementioned effects (1) and (2), it is possible to further obtain the aforementioned effects (3) and (5).

The present invention is not limited to the above embodiments. For instance, material of the ceramic layers c1 and c2 forming the package bodies 2*a* and 2*c* is not limited to the alumina, but could be a high temperature co-fired ceramic such as mullite and aluminium nitride or a low temperature co-fired ceramic such as glass-ceramic. Further, instead of the insulating layer formed by the ceramic layer, a layer made of resin such as epoxy resin could be used. In a case of the resin-made layer or the glass-ceramic-made layer, as material of the electrode pad, the side surface conductor, the via conductor, the connecting line and the back surface terminal, Cu (copper) or Ag (silver) is mainly used.

In addition, the number of the insulating layers forming the package bodies 2a and 2c could be three or more.

Further, the shape of the hollow portion in top view could be a regular polygon more than a pentagon or a deformed polygon, or a circle, an ellipse or an oval shape. However, regarding a width of the partition wall located between these hollow portions, it is required that a distance between closest adjacent two hollow portions have aforementioned minimum width.

Moreover, the shape of the electrode pad in top view is not especially limited as long as the electrode pad can cover at least the whole bottom surface of the hollow portion when viewed from above.

Furthermore, a plurality of sets of adjacent hollow portions 10 could be arranged separately from each other by a plurality of sets within one mounting area 6 of the front surface 3 of the package bodies 2a to 2d, when viewed from above. Further, an overall outside shape of the plurality of adjacent hollow portions 10 could substantially overlap one mounting area 6, when viewed from above.

On the front surface 3 of the package bodies 2a and 2c, two or more mounting areas 6 could be provided, and a plurality of hollow portions are arranged on each mounting area 6, and also the electrode pads are placed on respective bottom surfaces of the hollow portions.

Additionally, the packages 1a to 1d could be arranged in the lateral and longitudinal directions when viewed from above, and before or after the mount and electric connection of the electronic component, the packages could be split into a plurality of packages.

INDUSTRIAL APPLICABILITY

According to the present invention, it is possible to provide the package that is capable of reducing a tendency for a short circuit to occur between the plurality of electrode pads when electrically connecting the electronic component, which is mounted later on the mounting area included in the front surface of the package body formed by the plurality of stacked insulating layers, to the plurality of electrode pads, even if the plurality of electrode pads are adjacently arranged on the front surface of the package body.

EXPLANATION OF REFERENCE 1a to 1d . . . package
2a to 2d . . . package body
2n . . . inside layer surface
3 . . . front surface
4 . . . back surface
5 . . . side surface
6 . . . mounting area
7 . . . electronic component
8 . . . lead (external connecting terminal)
10 . . . hollow portion
11 . . . partition wall
12 . . . electrode pad
13 . . . extending portion
16 . . . side surface conductor (conductor layer)
17, 24 . . . back surface terminal (conductor layer)
19 . . . inner wall surface
21 . . . lead pin (external connecting terminal)
26 . . . ball terminal (external connecting terminal)
c1, c2 . . . ceramic layer (insulating layer)
c3 . . . frame member The entire contents of Japanese Patent Application No. 2019-005609 filed on Jan. 17, 2019 is incorporated herein by reference.

Although the invention has been described above by reference to certain embodiments of the invention, the invention is not limited to the embodiments described above. Modifications and variations of the embodiment described above will occur to those skilled in the art in light of the above teachings. The scope of the invention is defined with reference to the following claims.

What is claimed is:

1. A package comprising:
a package body formed by stacking a plurality of insulating layers and having a front surface including a mounting area of an electronic component, a back surface located at an opposite side to the front surface and a side surface located between the front surface and the back surface;
a plurality of hollow portions arranged so as to be adjacent to each other and opening on the front surface of the package body;
a plurality of electrode pads individually placed on respective bottom surfaces of the hollow portions; and
a partition wall formed by at least one insulating layer that forms the package body and having protruding banks that swell upward at both edge sides, on a front surface side, of the partition wall, and wherein
surfaces of the electrode pads are located at a lower position with respect to the front surface of the package body,
the plurality of hollow portions are arranged, when viewed from above, so as to be adjacent to each other at opposite sides of the partition wall, and
the electrode pads are electrically connected to respective conductor layers that are formed on the back surface and/or the side surface of the package body.

2. The package as claimed in claim 1, wherein:
the plurality of hollow portions and the mounting area of the electronic component are separate from each other or overlap each other, when viewed from above, on the front surface of the package body.

3. The package as claimed in claim 1, wherein:
each of the electrode pads has, at least at one side thereof, an extending portion that extends on an inside layer surface between the insulating layers forming the package body.

4. The package as claimed in claim 1, wherein:
the surfaces of the electrode pads are electrically connected to respective external connecting terminals of the electronic component mounted on the mounting area, or electrically connected to the electronic component with bonding wires.

5. The package as claimed in claim 1, further comprising:
a frame member having a frame shape along an outer periphery of the front surface on the front surface of the package body, and wherein
the hollow portions and the mounting area are enclosed with an inner wall surface of the frame member.

* * * * *